US008184262B2

(12) United States Patent
Arif

(10) Patent No.: US 8,184,262 B2
(45) Date of Patent: May 22, 2012

(54) PULSE TO PULSE ENERGY EQUALIZATION OF LIGHT BEAM INTENSITY

(75) Inventor: Muhammad Arif, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 820 days.

(21) Appl. No.: 12/250,737

(22) Filed: Oct. 14, 2008

(65) Prior Publication Data
US 2009/0310111 A1 Dec. 17, 2009

Related U.S. Application Data

(60) Provisional application No. 60/980,059, filed on Oct. 15, 2007.

(51) Int. Cl.
G03B 27/32 (2006.01)
G03B 27/42 (2006.01)
G03B 27/54 (2006.01)
G03B 27/72 (2006.01)
H01S 3/10 (2006.01)
H01S 3/13 (2006.01)

(52) U.S. Cl. ............... 355/35; 355/53; 355/67; 355/71; 355/77; 372/21; 372/29.02

(58) Field of Classification Search .................. 355/35, 355/53, 67, 71, 77; 359/302, 308, 336, 359; 372/21, 25, 29.02–29.022, 30–31
See application file for complete search history.

(56) References Cited

U.S. PATENT DOCUMENTS 5,319,654 A * 6/1994 Urakami et al. ................. 372/7
2004/0239907 A1* 12/2004 Hintersteiner et al. ......... 355/67

FOREIGN PATENT DOCUMENTS
JP 04-287994 A 10/1992

OTHER PUBLICATIONS

English-Language Abstract for JP 04-287994 A, published Oct. 13, 1992; 1 page.
Engish-Language Translation of Notification of Reason(s) for Refusal directed to related Japanese Patent Application No. 2008-265939, mailed Jun. 14, 2011, from the Japanese Patent Office; 3 pages.
Boyd, Robert W., *Nonlinear Optics*, Academic Press, San Diego, California, 1992, pp. 159-164 and 262-263.
Awwal et al., "Information Processing and Micro-Optical System: Free Space Optical Computing," Encyclopedia of Modern Optics, Ed. Bob D. Guenther, Elsevier, vol. 2, pp. 247-256, Dec. 2004.

* cited by examiner

*Primary Examiner* — Hung Henry Nguyen
*Assistant Examiner* — Colin Kreutzer
(74) *Attorney, Agent, or Firm* — Sterne, Kessler, Goldstein & Fox P.L.L.C.

(57) ABSTRACT

A system for equalizing pulse to pulse energy of a light beam includes a group of optical devices including an optical device configured to exhibit third order nonlinear properties. Transmission properties of an unequalized light beam passing through the group of optical devices change such that an output intensity of a resulting light beam output from the optical devices is equalized. One example configuration includes a beam splitter, a nonlinear interference filter, a mirror and a beam combiner. A first portion of the light beam that is reflected from the nonlinear interference filter is combined with the light beam such that a resulting combined light beam has equalized output intensity. Another example includes at least first and second prisms having third order nonlinear properties and configured as a beam steering system. A lithography system and a method of equalizing pulse to pulse energy in a light beam are also presented.

19 Claims, 9 Drawing Sheets

PULSE TO PULSE ENERGY EQUALIZATION OF LIGHT BEAM INTENSITY

CROSS REFERENCE TO RELATED APPLICATION(S)

This application claims the benefit of U.S. Provisional Application No. 60/980,059, filed Oct. 15, 2007, which is incorporated by reference herein in its entirety.

BACKGROUND

1. Field of the Invention

The present invention is directed generally to optics. More particularly, the present invention relates to equalizing output intensity of a light beam useful in lithographic processing.

2. Related Art

A lithographic apparatus is a machine that applies a desired pattern onto a substrate or part of a substrate. A lithographic apparatus may be used, for example, in the manufacture of flat panel displays, integrated circuits (ICs) and other devices involving fine structures. In a conventional apparatus, light is directed to a patterning device, which may be referred to as a mask, a reticle, an array of individually programmable or controllable elements (maskless), or the like. The patterning device may be used to generate a circuit pattern corresponding to an individual layer of an IC, flat panel display, or other device. This pattern may be transferred onto all or part of the substrate (e.g., a glass plate, a wafer, etc.), by imaging onto a layer of radiation-sensitive material (e.g., resist) provided on the substrate. The imaging may include the processing of light through a projection system, which may include optical components such as mirrors, lenses, beam splitters, and the like. Other components or devices may exist in a lithographic apparatus that can also contain optical components.

Some lithography apparatuses require extremely small dose control variation. For example, some tools require less than 0.5% dose control variation for single pulse printing. The pulse to pulse variation from a light source, such as a laser, can be upwards of 10% or more. One currently-used solution to this problem is the use of a Pockel's Cell. A Pockel's Cell is an electro-optic device that can be used as a switch. It modifies the phase between two polarization states (fast and slow axis). A Pockel's Cell can be used between crossed polarizers to modulate, or control, the intensity of an optical beam. The effect on which a Pockel's Cell device is based is called Pockel's effect or linear electro-optical effect. There are many downsides to using a Pockel's Cell approach, however. These downsides include the requirement of a very high voltage, optics that take up a large volume of space and are very complicated, extremely complex detection and switching electronics, and deterioration of transmission due to two photon absorption/color center formation.

BRIEF SUMMARY

In an embodiment, a system for equalizing pulse to pulse energy of a light beam having an unequalized input intensity includes a group of optical devices including an optical device configured to exhibit third order nonlinear properties. The transmission properties of an unequalized light beam passing through the group of optical devices change, such that an output intensity of a resulting light beam output from the optical devices is equalized.

In one example, the group of optical devices may include a beam splitter that receives the unequalized light beam and reflects and passes the unequalized light beam. The group of optical devices also includes a nonlinear interference filter that receives the reflected unequalized light beam from the beam splitter, reflects a first portion of the unequalized light beam, and passes a second portion of the unequalized light beam. The group of optical devices further includes a mirror that receives the first portion of the unequalized light beam from the nonlinear interference filter and reflects the first portion of the unequalized light beam. Also included is a beam combiner that receives the transmitted unequalized light beam from the beam splitter and that receives the reflected first portion of the unequalized light beam from the mirror and combines the received beams into the output light beam having equalized output intensity.

In another example, the group of optical devices may include at least first and second prisms configured as a beam steering system, where the prisms may each have third order nonlinear properties. The unequalized light beam enters and is processed by the first prism, and the processed light beam is then passed to, and processed by, the second prism. The group of optical devices may also include an aperture following the prisms that receives the processed light beam from the second prism and passes the output light beam having equalized output intensity.

A lithography system is also presented. In an embodiment, the lithography system includes a source of radiation configured to emit a beam of radiation, an illumination system configured to process the beam of radiation, a patterning device configured to pattern the processed beam of radiation, and a projection system configured to project the patterned beam of radiation onto a target portion of a substrate. The system further includes a pulse to pulse energy equalizer located downstream of the source of radiation and comprising a group of optical devices including an optical device with third order nonlinear properties. Effective transmission properties of the beam of radiation are changed as the beam of radiation passes through the group of optical devices, such that an output intensity of the beam of radiation is equalized as it leaves the group of optical devices.

A method of equalizing pulse to pulse energy in a light beam is also presented. In an embodiment, transmission properties of a light beam are altered by passing the light beam through optical material having third order nonlinear properties, and processing the light beam, such that pulse to pulse energy variation in the light beam stabilizes. In an embodiment, the altered transmission properties of the light beam differ depending on an incident intensity level of the light beam. In one example, the light beam is combined with a first portion of the light beam reflected from the optical material, such that a resulting combined light beam has equalized output intensity. In another example, the altering of transmission properties includes steering the light beam based on an effective refractive index that is based on an incident intensity level of the light beam. In this example, the light beam may further be passed through an aperture.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION

While specific configurations, arrangements, and steps are discussed, it should be understood that this is done for illustrative purposes only. A person skilled in the pertinent art(s) will recognize that other configurations, arrangements, and steps may be used without departing from the spirit and scope of the present invention. It will be apparent to a person skilled in the pertinent art(s) that this invention may also be employed in a variety of other applications.

It is noted that references in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of one skilled in the art to incorporate such a feature, structure, or characteristic in connection with other embodiments whether or not explicitly described.

Figure 1:
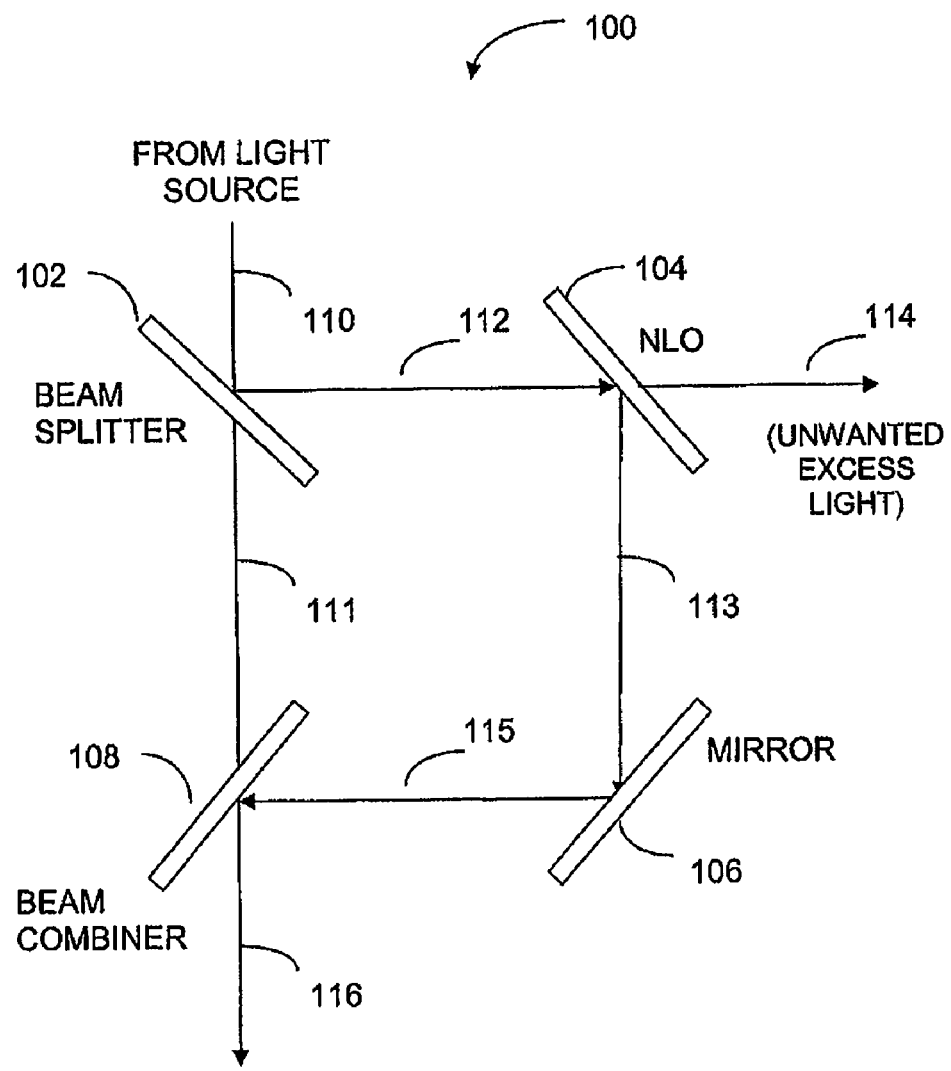
FIG. 1 depicts an exemplary pulse to pulse equalizing system, according to an embodiment of the present invention.

FIG. 1 depicts an exemplary pulse to pulse equalizing system 100, according to an embodiment of the present invention. System 100 includes a beam splitter 102, a nonlinear optical (NLO) device 104 (e.g., an interference filter), a mirror 106, and a beam combiner 108. Beam splitter 102 receives a light beam 110 from a light source (not shown), such as a laser, and passes a portion of the light beam (beam 111) and reflects a portion of the light beam (beam 112). The NLO device 104 receives the reflected light beam 112 from beam splitter 102.

NLO device 104 comprises a nonlinear material having third order nonlinearity. A material having third order nonlinearity has third order non-linear interactions, such as third harmonic generation and an intensity dependent refractive index (also known as the Optical Kerr Effect, further discussed below). In FIG. 1, the NLO device 104 is made out of a nonlinear optical material showing third order nonlinearity and coated on two surfaces with a partially reflective coating to make a nonlinear Fabry-Perot interference filter. This can also be done by placing the nonlinear optical material between two partially reflective discrete mirrors. When a nonlinear material having third order nonlinearity is placed inside a Fabry-Perrot cavity, it shows bistability. Depending on the intensity of the received light beam 112 reflected from beam splitter 102, NLO device 104 reflects and passes the light beam 112 at differing intensities. In other words, the transmission properties of NLO device 104 will differ based on the incident intensity of the light beam 112. For example, if the intensity of the reflected light beam 112 received at NLO device 104 is, or becomes, below a certain threshold, most of the light beam 112 will get reflected by NLO device 104 (as beam 113), and the output intensity of the beam transmitted through NLO device 104 (as beam 114) will be lower than the reflected beam 113. On the other hand, if the intensity of the reflected light beam 112 received at NLO device 104 is, or becomes, higher than a certain threshold, most of the light beam 112 will be transmitted through NLO device 104 (as beam 114), and the amount of beam 112 reflected by NLO device 104 (as beam 113) will be lower. NLO device 104 essentially works as a gate or filter. For a stronger beam (i.e., a beam with a high incident intensity), a larger portion is transmitted through NLO device 104 and a smaller portion is reflected, and for a weaker beam (i.e., a beam with a low incident intensity), a smaller portion is transmitted through NLO device 104, and a larger portion is reflected.

Figure 2:
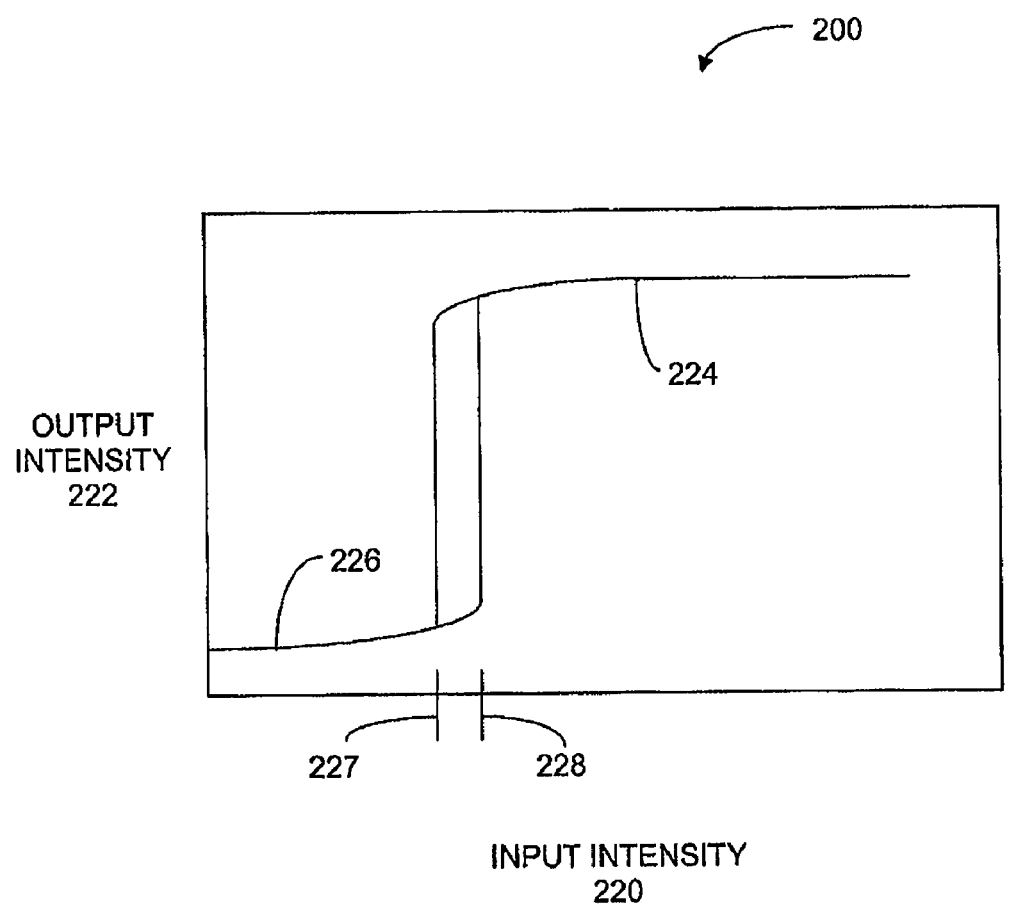
FIG. 2 is a graph showing transmission properties of a bistable device, such as the nonlinear optical device shown in FIG. 1, according to an embodiment of the present invention.

Exemplary bistable properties of NLO device 104 can be shown in graph 200 of FIG. 2. In graph 200, the input intensity (or incident intensity) of a light beam incident on NLO device 104 is shown by the horizontal axis 220, and the output intensity of a light beam transmitted through NLO device 104 is shown by the vertical axis 222. For lower input intensities, lower than a certain threshold, the output intensity is lower, as shown by lower plot 226. In contrast, for higher input intensities, higher than a certain threshold, the output intensity is higher, as shown by higher plot 224. As shown in graph 200, the relevant threshold can differ depending on whether the input intensity is dropping below a threshold (e.g., threshold 227) from a higher intensity or rising above a threshold (e.g., threshold 228) from a lower intensity.

Referring back to FIG. 1, NLO device 104 passes beam 112 as beam 114, having an intensity dependent on the incident intensity of beam 112, as discussed above. In this example, beam 114 is unwanted excess light. NLO device 104 reflects beam 112 as beam 113, also having an intensity dependent on the incident intensity of beam 112, as discussed above. In this way, NLO device 104 acts as an optical gate, for which the transmission property changes based on the incident intensity. The switching time for this optical gate can be approximately $10^{-12}$ seconds. Mirror 106 receives beam 113 and reflects beam 113 toward beam combiner 108 as beam 115. Beam combiner 108 also receives beam 111 from beam splitter 102. Beam combiner 108 then combines beams 111 and 115 to form combined beam 116. The effect of utilizing a system such as system 100 is that combined beam 116 will have an equalized total intensity. For more information on nonlinear optics and optics, see Boyd, Robert W., *Nonlinear*

*Optics*, Academic Press, San Diego, Calif., 1992, pp. 159-164 and 262-263, and Awwal, A. A. S. and Arif, M., "Information Processing and Micro-Optical System: Free Space Optical Computing," in *Encyclopedia of Modern Optics*, Ed. Bob D. Guenther, Elsevier, Vol. 2, pp. 247-256, December 2004, both of which are incorporated by reference herein in their entireties.

Figure 3:
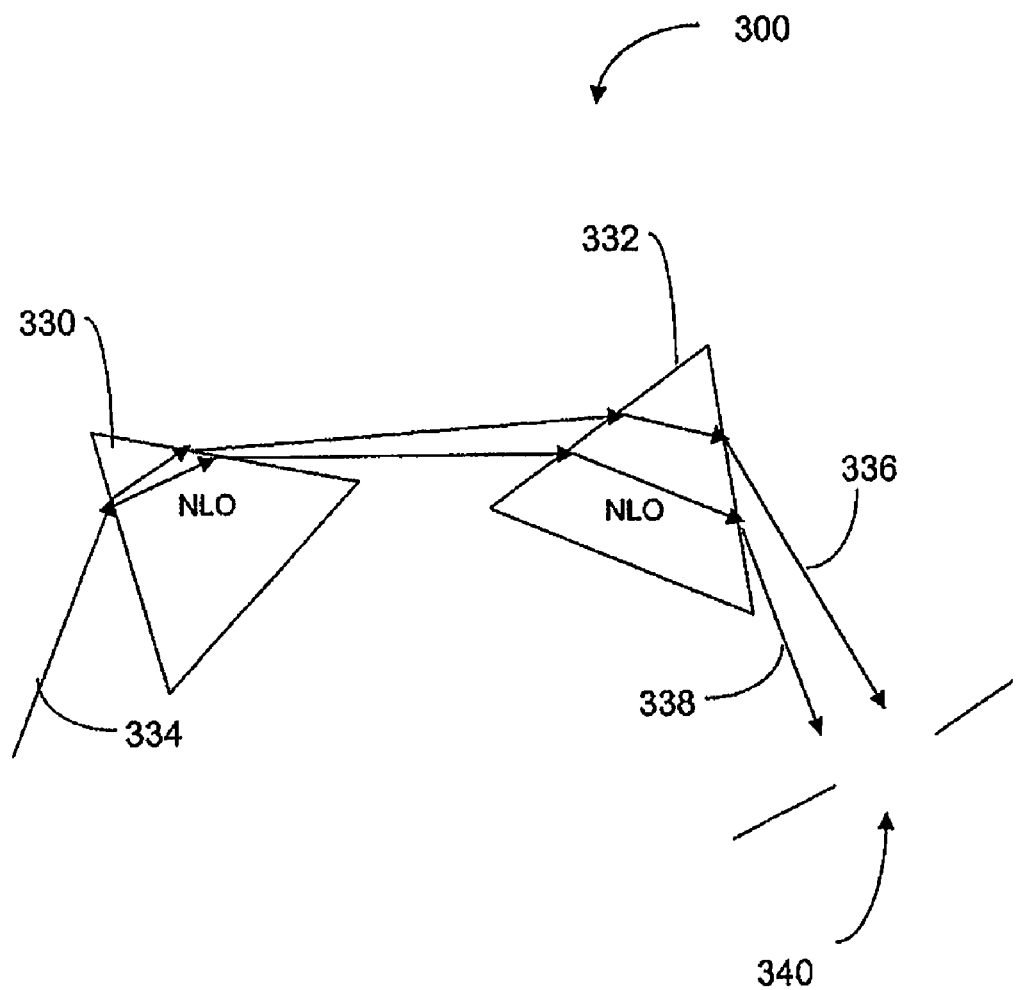
FIG. 3 depicts an exemplary pulse to pulse equalizing system, according to an embodiment of the present invention.

FIG. 3 depicts another exemplary pulse to pulse equalizing system 300, according to an embodiment of the present invention. System 300 includes prisms 330 and 332 configured as a beam steering system, and each having third order nonlinearity. As discussed above, the presence of third order nonlinearity in optical matter gives rise to an intensity dependent refractive index, also known as the Optical Kerr Effect. Depending on the incident intensity level of a light beam entering each prism, the light beam will have an effectively different refractive index inside the prism. For example, a light beam 334 received by first prism 330 that has a lower incident intensity will experience an effective refractive index resulting in a beam as shown in upper beam 336. In contrast, a light beam 334 received by first prism 330 that has a higher incident intensity will see experience an effective refractive index resulting in a beam as shown in lower beam 338. Prisms 330 and 332 can be used to create a very efficient beam steering system based on the input intensity. When accompanying the prisms 330 and 332 with an aperture, such as hard aperture 340, to limit the intensity further through, the system becomes a very efficient pulse to pulse optical limiter that stabilizes the pulse to pulse variation.

In the example shown in FIG. 3, only two prisms are shown. However, the invention is not to be limited to two prisms. The number of prisms used depends on how much variation is present in the input beam, how tight the variation is to be stabilized, and the level of the input intensity.

The Optical Kerr Effect is usually small for a low input intensity. For a higher input intensity, however, the refractive index can be shown as $n=n_0+n_2 I$, where no is the linear portion of the refractive index, $n_2$ is the nonlinear portion of the refractive index, and I is the intensity of the incident beam. For further information on this refractive index and nonlinear optics, see Boyd, Robert W., *Nonlinear Optics*, Academic Press, San Diego, Calif., 1992, pp. 159-164 and 262-263, which is incorporated by reference herein in its entirety.

The exemplary systems 100 and 300 are two example systems for accomplishing the equalizing or stabilizing of pulse to pulse variation.

However, many different systems, and configurations of each system, using nonlinear optical devices having third order nonlinear properties, can be contemplated after reviewing this disclosure. For example, system 100 can be cascaded and system 300 can contain more than two prisms for added control.

Figure 4:
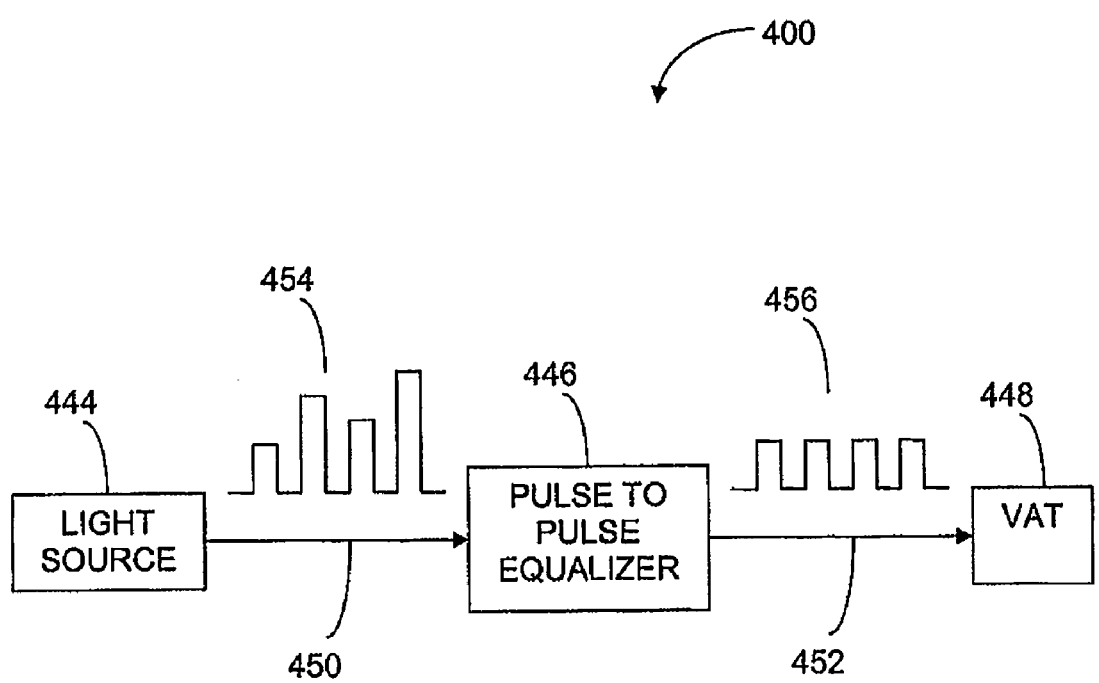
FIG. 4 is a block diagram showing equalization of a pulse train after passing through a nonlinear optical device, such as the exemplary ones depicted in the pulse to pulse equalizing systems of FIGS. 1 and 3, according to an embodiment of the present invention.

FIG. 4 is a block diagram showing the equalization of a pulse train after passing through a nonlinear optical device, such as that depicted in the pulse to pulse equalizing systems of FIGS. 1 and 3, according to an embodiment of the present invention. FIG. 4 shows a pulse to pulse equalization system 400 comprising a light source 444, a pulse to pulse equalizer 446 (such as system 100 or 300), and an optional variable optical attenuator (VAT) 448. VAT 448 is used to control the dose of light. It controls the energy (or intensity) in the system. This is a beneficial control for an illumination system. The light source emits a light beam 450 with an unequalized pulse train 454. Pulse to pulse equalizer 446 receives light beam 450 and passes light beam 452 to VAT 448. Light beam 452 has an equalized pulse train 456. Using system 400, radiation dose can be set based on a deterministic model by VAT 448 without the need to detect, measure, and cut any fluence. This means that VAT 448 does not have to depend on a measured pulse energy to select the required setting. Rather VAT 448 can be configured without knowing the energy of the individual pulses, since the energy is already stabilized pulse to pulse.

Figure 5:
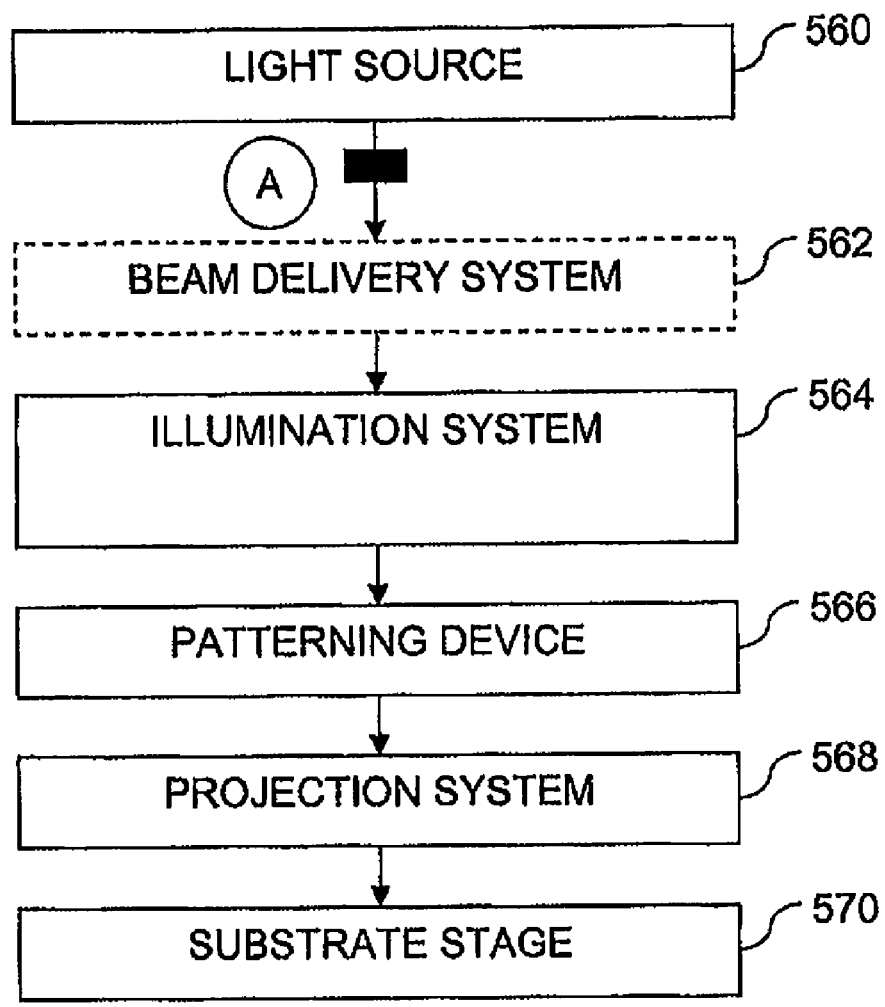
FIG. 5 is a block diagram of an exemplary lithography system, which may include a pulse to pulse equalizing system, such as the exemplary ones shown in FIGS. 1 and 3, according to an embodiment of the present invention.

FIG. 5 is a block diagram of an exemplary lithography system 500 that may include a pulse to pulse equalizing system, according to an embodiment of the present invention. Lithography system 500 includes a light source 560, an optional beam delivery system 562, an illumination system 564, a patterning device 566, a projection system 568, and a substrate stage 570. a pulse to pulse equalizing system, such as system 100 or 300, may be located anywhere downstream of light source 560, depending on where pulse to pulse equalization is desired. Ideally, the pulse to pulse equalizing system is located very soon after light source 560 in lithography system 500, such as directly after light source 560 (at, for example, location "A" as depicted in FIG. 5), to eliminate any pulse to pulse intensity variation in the remainder of the lithography system 500.

Although specific reference may have been made above to the use of embodiments of the invention in the context of optical lithography, it will be appreciated that the invention can be used in other applications and optical systems in which stabilizing pulse to pulse energy is desired.

Figure 6:
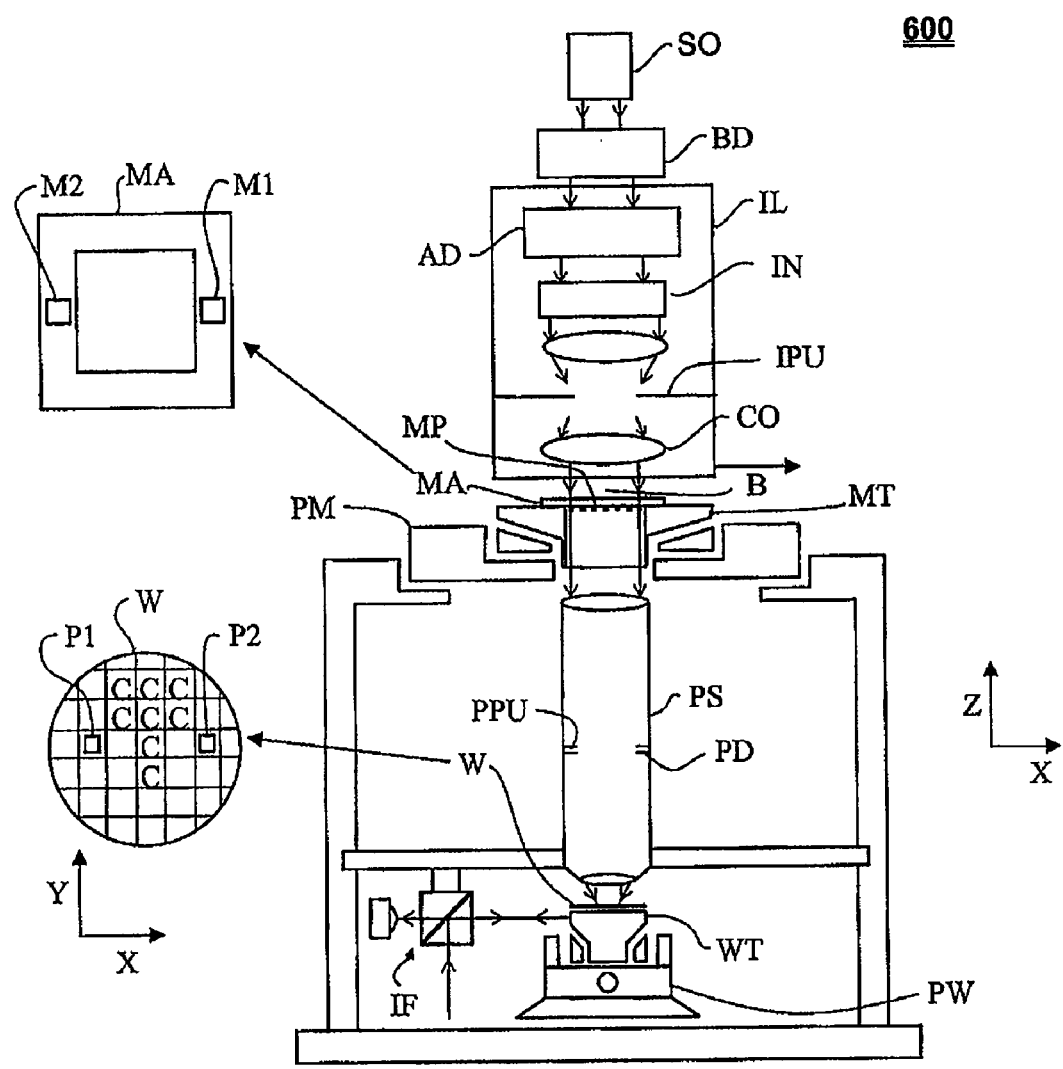
FIG. 6 is a diagram of another exemplary lithography system, which may include a pulse to pulse equalizing system, such as the exemplary ones shown in FIGS. 1 and 3, according to an embodiment of the present invention.

It would be understood by one skilled in the relevant art(s) that lithography system 500 is just one example of a system that may include pulse to pulse equalizing system 100 or 300, where another exemplary system is shown in FIG. 6. FIG. 6 depicts a lithographic apparatus according to an embodiment of the invention. The apparatus comprises an illumination system IL, a support structure MT, a substrate table WT, and a projection system PS.

The illumination system IL is configured to condition a radiation beam B (e.g., a beam of UV radiation as provided by a mercury arc lamp, or a beam of DUV radiation generated by a KrF excimer laser or an ArF excimer laser).

The support structure (e.g., a mask table) MT is constructed to support a patterning device (e.g., a mask or dynamic patterning device) MA having a mask pattern MP and connected to a first positioner PM configured to accurately position the patterning device in accordance with certain parameters.

The substrate table (e.g., a wafer table) WT is constructed to hold a substrate (e.g., a resist-coated wafer) W and connected to a second positioner PW configured to accurately position the substrate in accordance with certain parameters.

The projection system (e.g., a refractive projection lens system) PS is configured to project a pattern imparted to the radiation beam B by the pattern MP of the patterning device MA onto a target portion C (e.g., comprising one or more dies) of the substrate W.

The illumination system may include various types of optical components, such as refractive, reflective, and diffractive types of optical components, or any combination thereof, for directing, shaping, or controlling radiation. The illumination system may also include a pulse to pulse equalizer, as described above with respect to FIGS. 1 and 3.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern MP includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which may be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, and catadioptric optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 6, the illumination system IL receives a radiation beam from a radiation source SO. The source and the lithographic apparatus may be separate entities, for example when the source is an excimer laser. In such cases, the radiation beam is passed from the source SO to the illumination system IL with the aid of a beam delivery system BD comprising, for example, suitable directing mirrors and/or a beam expander. In other cases the source may be an integral part of the lithographic apparatus, for example when the source is a mercury lamp. The source SO and the illumination system IL, together with the beam delivery system BD if required, may be referred to as a radiation system.

The illumination system IL may comprise an adjuster AD for adjusting the angular intensity distribution of the radiation beam at mask level. Generally, at least the outer and/or inner radial extent (commonly referred to as σ-outer and σ-inner, respectively) of the intensity distribution in a pupil IPU of the illumination system can be adjusted. In addition, the illumination system IL may comprise various other components, such as an integrator IN and a condenser CO. The illumination system may be used to condition the radiation beam, to have a desired uniformity and intensity distribution in its cross-section at mask level.

The radiation beam B is incident on the patterning device (e.g., mask MA or programmable patterning device), which is held on the support structure (e.g., mask table MT), and is patterned by the patterning device in accordance with a pattern MP. Having traversed the mask MA, the radiation beam B passes through the projection system PS, which focuses the beam onto a target portion C of the substrate W.

The projection system has a pupil PPU conjugate to the illumination system pupil IPU, where portions of radiation emanating from the intensity distribution at the illumination system pupil IPU and traversing a mask pattern without being affected by diffraction at a mask pattern create an image of the intensity distribution at the illumination system pupil IPU.

With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 8) may be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation may be readily applied to maskless lithography that utilizes a programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm).

Figure 7:
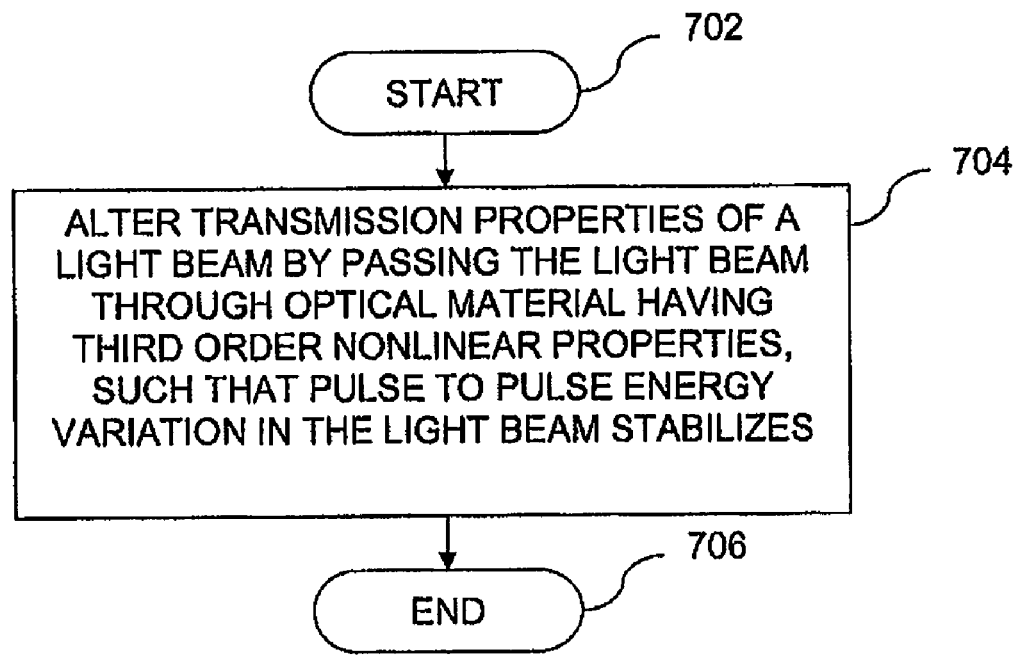
FIG. 7 is a flowchart depicting a method of equalizing pulse to pulse energy of a light beam, according to an embodiment of the present invention.

FIG. 7 is a flowchart depicting a method 700 of equalizing pulse to pulse energy in a light beam. Method 700 begins at step 702 and immediately proceeds to step 704. In step 704, transmission properties of a light beam are altered by passing the light beam through optical material having third order nonlinear properties, such that pulse to pulse energy variation in the light beam stabilizes. Method 700 ends at step 706.

Figure 8:
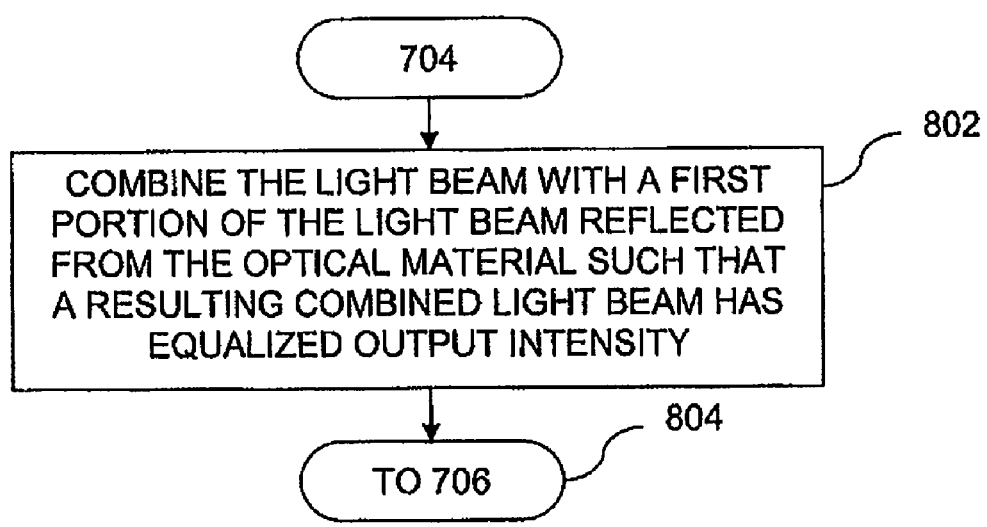
FIGS. 8 and 9 are flowcharts depicting possible examples of step 704 of the method shown in FIG. 7, according to various embodiments of the present invention.
Figure 9:
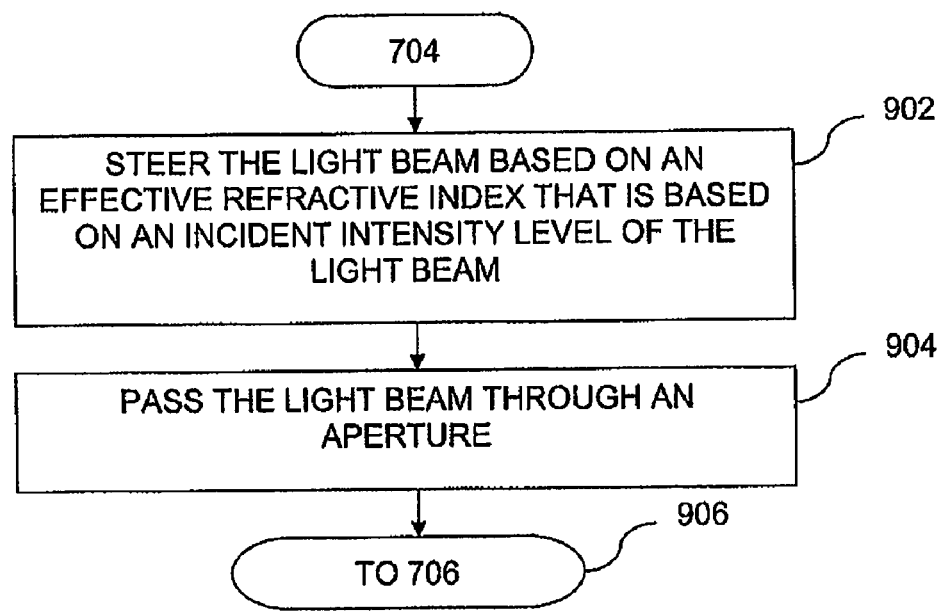

FIGS. 8 and 9 are flowcharts depicting possible examples of step 704 of the method shown in FIG. 7, according to embodiments of the present invention. FIG. 8 is a flowchart depicting a possible example process 800 of step 704 of equalizing pulse to pulse energy in a light beam using the pulse to pulse equalizer described with reference to system 100 of FIG. 1. Example process 800 begins at step 802. In step 802, the light beam is combined with a first portion of the light beam reflected from the optical material, such that a resulting combined light beam has equalized output intensity. In step 804, example 800 returns to step 706 of method 700.

FIG. 9 is a flowchart depicting a possible example process 900 of step 704 of equalizing pulse to pulse energy in a light beam using the pulse to pulse equalizer described with reference to system 300 of FIG. 3. Example process 900 begins at step 902. In step 902, the light beam is steered based on a refractive index dependent upon an incident intensity level of the light beam. In step 904, the light beam is passed through an aperture. In step 906, example 800 returns to step 706 of method 700.

The above-described pulse to pulse equalization systems may be used to stabilize pulse to pulse variation in optical systems, including lithography systems. It is to be appreciated that the above-described embodiments may be used in mask-based lithography, as well as, maskless lithography. The embodiments may also be used for immersion lithography, interferometric lithography, or in other systems that include a similar functioning optical system.

The preceding description describes pulse to pulse equalization using nonlinear optical material that provides an elegant and effective way to control light with light. This can make optical designs much less expensive and compact. A delay line that would otherwise be necessary for Pockel's Cell trimming can be eliminated. The electronics become simpler and less expensive because light is controlling light in real time. In fact, this may allow for control of pulse to pulse variation without any need for electronics. As stated earlier, this allows a radiation dose to be set using a variable optical attenuator (VAT), for example, without any need to detect, measure, and cut any fluence.

Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system for equalizing pulse to pulse energy of a light beam having an unequalized input intensity, comprising:
a group of optical devices including a nonlinear interference filter configured to exhibit third order nonlinear properties that receives an unequalized light beam, the nonlinear interference filter comprising a bistable device configured to reflect a first portion of the unequalized light beam and pass a second portion of the unequalized light beam such that:
when an input intensity of the received unequalized light beam is higher than a first threshold, the bistable device passes a greater amount of the second portion of the unequalized light beam than previously passed and reflects a smaller amount of the reflected first portion than previously reflected, and
when the input intensity of the received unequalized light beam is lower than a second threshold, the bistable device passes a smaller amount of the second portion of the unequalized light beam than previously passed and reflects a greater amount of the reflected first portion than previously reflected,
wherein transmission properties of the unequalized light beam passing through the group of optical devices change, such that an output intensity of a resulting light beam output from the optical devices is equalized.

2. The system of claim 1, wherein the group of optical devices further comprises:
a beam splitter that receives the unequalized light beam and reflects and passes the unequalized light beam to the nonlinear interference filter;
a mirror that receives the first portion of the unequalized light beam from the nonlinear interference filter and reflects the first portion of the unequalized light beam; and
a beam combiner that receives the transmitted unequalized light beam from the beam splitter and receives the reflected first portion of the unequalized light beam from the mirror and combines the received beams into the output light beam having equalized output intensity.

3. The system of claim 1, further comprising:
a light source configured to produce the unequalized light beam and provide the unequalized light beam to the group of optical devices;
an illumination system configured to process the output light beam; and
a patterning device configured to pattern the processed light beam.

4. The system of claim 3, further comprising:
a beam delivery system configured to direct the resulting light beam between the group of optical devices and the illumination system.

5. The system of claim 3, further comprising:
a projection system configured to project the patterned light beam onto a target portion of a substrate.

6. The system of claim 3, wherein the light source is a laser.

7. The system of claim 3, wherein the group of optical devices is located downstream of the light source.

8. The system of claim 7, wherein the group of optical devices is located directly after the light source.

9. The system of claim 1, wherein the bistable device passes a greater amount of the second portion of the unequalized light beam than the amount of the reflected first portion when the input intensity of the received unequalized light beam is higher than the first threshold, and
the bistable device passes a smaller amount of the second portion of the unequalized light beam than the amount of the reflected first portion when the input intensity of the received unequalized light beam is lower than the second threshold.

10. The system of claim 1, wherein the nonlinear interference filter comprises a partially reflective coating on first and second surfaces to form a Fabry-Perot interference filter.

11. The system of claim 1, further comprising:
a light source that provides the unequalized light beam to the group of optical devices; and
a variable optical attenuator that receives the output light beam and provides dose control.

12. A lithography system comprising:
a source of radiation configured to emit a beam of radiation;
an illumination system configured to process the beam of radiation;
a patterning device configured to pattern the processed beam of radiation;
a projection system configured to project the patterned beam of radiation onto a target portion of a substrate; and
a pulse to pulse energy equalizer located downstream of the source of radiation and comprising a group of optical devices including an interference filter with third order nonlinear properties, the interference filter comprising a bistable device configured to reflect a first portion of the beam of radiation and pass a second portion of the beam of radiation such that:
when an input intensity of the received beam of radiation is higher than a first threshold, the bistable device passes a greater amount of the second portion of the beam of radiation than previously passed and reflects a smaller amount of the reflected first portion than previously reflected, and
when the input intensity of the received beam of radiation is lower than a second threshold, the bistable device passes a smaller amount of the second portion of the beam of radiation than previously passed and reflects a greater amount of the reflected first portion than previously reflected,
wherein effective transmission properties of the beam of radiation are changed as the beam of radiation passes through the group of optical devices such that an output intensity of the beam of radiation is equalized as it leaves the group of optical devices.

13. The system of claim 12, wherein the interference filter comprises a partially reflective coating on first and second surfaces to form a nonlinear Fabry-Perot interference filter.

14. The system of claim 12, wherein the pulse to pulse energy equalizer is located directly after the source of radiation.

15. The system of claim 12, wherein the bistable device passes a greater amount of the second portion of the received beam of radiation than the amount of the reflected first portion when the input intensity of the received beam of radiation is higher than the first threshold, and
the bistable device passes a smaller amount of the second portion of the received beam of radiation than the amount of the reflected first portion when the input intensity of the received beam of radiation is lower than the second threshold.

16. A method of equalizing pulse to pulse energy in a light beam, comprising:
altering transmission properties of a light beam by passing the light beam through optical material having third order nonlinear properties, wherein the optical material is placed in a Fabry-Perot cavity to provide bistability, such that when an input intensity of the light beam on the optical material is higher than a first threshold, the optical material reflects a smaller amount of a reflected first portion of the light beam than previously reflected, and the optical material passes a greater amount of a second portion of the light beam than previously passed; and when the input intensity of the light beam on the optical material is lower than a second threshold, the optical material passes a smaller amount of the second portion of the light beam than previously passed, and the optical material reflects a greater amount of the reflected first portion than previously reflected; and processing the light beam, such that pulse to pulse energy variation in the light beam stabilizes.

17. The method of claim 16, wherein the altered transmission properties of the light beam differ depending on an incident intensity level of the light beam.

18. The method of claim 16, wherein the processing the light beam comprises:

combining the light beam with the first portion reflected from the optical material such that a resulting combined light beam has equalized output intensity.

19. The method of claim 16, wherein the optical material reflects a smaller amount of the reflected first portion of the light beam than the amount of the passed second portion of the light beam when the input intensity of the light beam is higher than the first threshold, and the optical material passes a smaller amount of the second portion of the light beam than the amount of the reflected first portion when the input intensity of the light beam is lower than the second threshold.

* * * * *